(12) United States Patent
Nagai

(10) Patent No.: US 8,680,600 B2
(45) Date of Patent: Mar. 25, 2014

(54) VERTICAL TRANSISTOR STRUCTURE AND METHOD OF MANUFACTURING SAME

(75) Inventor: Yukihiro Nagai, Taichung (TW)

(73) Assignee: Rexchip Electronics Corporation, Taichung (TW)

( * ) Notice: Subject to any disclaimer, the term of this patent is extended or adjusted under 35 U.S.C. 154(b) by 13 days.

(21) Appl. No.: 13/337,810

(22) Filed: Dec. 27, 2011

(65) Prior Publication Data

US 2013/0161715 A1    Jun. 27, 2013

(51) Int. Cl.
*H01L 27/108* (2006.01)
(52) U.S. Cl.
USPC ............ 257/306; 257/E27.088; 257/E21.629; 438/268
(58) Field of Classification Search
USPC .......................................... 257/306
See application file for complete search history.

(56) References Cited

U.S. PATENT DOCUMENTS

| 7,326,611 B2 | 2/2008 | Forbes | |
| 8,320,153 B2 * | 11/2012 | Sommer | 365/94 |
| 2005/0190617 A1 | 9/2005 | Forbes et al. | |
| 2006/0024886 A1 * | 2/2006 | Ferrant et al. | 438/257 |
| 2006/0113587 A1 * | 6/2006 | Thies et al. | 257/328 |
| 2012/0181606 A1 * | 7/2012 | Nagai | 257/334 |
| 2012/0286351 A1 * | 11/2012 | Kim | 257/329 |

* cited by examiner

*Primary Examiner* — A. Sefer
(74) *Attorney, Agent, or Firm* — Muncy, Geissler, Olds & Lowe, P.C.

(57) ABSTRACT

A vertical transistor structure includes a substrate, a plurality of pillars located on the substrate and spaced from each other at a selected distance, a gate line and a plurality of conductors. The pillars are aligned in a straight line in a first direction and have respectively a primary control wall along the first direction and two ancillary control walls perpendicular to the primary control wall. The gate line is connected to the primary control wall in the first direction through a first isolated layer. The conductors are interposed between the ancillary control walls through second isolated layers. By providing the gate line merely on the primary control wall and the conductors to aid the gate line to control ON/OFF of the pillars, problems of etching and separating gate material during gradually shrunken feature size process that are difficult to control etching positions and etching duration can be prevented.

4 Claims, 13 Drawing Sheets

VERTICAL TRANSISTOR STRUCTURE AND METHOD OF MANUFACTURING SAME

FIELD OF THE INVENTION

The present invention relates to a semiconductor structure and particularly to a vertical transistor structure and a method of manufacturing same.

BACKGROUND OF THE INVENTION

Constant advances of semiconductor manufacturing technology have greatly shrunken the size of electronic elements and also greatly reduced their production costs. Conventional semiconductor manufacturing techniques generally adopt an approach such as etching, ion implantation or routing on a substrate to form a planar semiconductor structure. These techniques now can fabricate a chip at a minimum size of 6F2. However, as developments of feature size have been gradually slowed down, area occupied by semiconductors on wafers cannot be significantly reduced. As a result, a vertical (also called three-dimensional) semiconductor manufacturing technology has been developed that aims to grow semiconductors vertically on the wafer to reduce the area occupied by transistors on the wafer surface and can further shrink the size of the chip to 4F2.

For instance, U.S. Pat. No. 7,326,611 entitled "DRAM arrays, vertical transistor structures and methods of forming transistor structure and DRAM Arrays" and U.S. publication No. 2005/0190617 entitled "Folded bit line DRAM with vertical ultra thin body transistors" disclose a vertical pillar transistor structure and method and process of manufacturing same. Please refer to FIG. 1 for a conventional vertical Dynamic Random Access Memory (DRAM) which has a pillar 1 and a gate material 2 next to the pillar 1 to control ON/OFF of the pillar 1 functioning as a transistor. The gate material 2 usually is formed by etching a metal wire to generate two pins to attach to two sides of the pillar 1 without contacting with each other but being connected via a conductive wire 3 so that a voltage can be applied to the pillar 1 for controlling ON or OFF thereof and data can be stored or read via a capacitor 4 located on the pillar 1. However, in the present technique, as the minimum feature size has been reduced to 40 nm, the thickness of metal wires and intervals between them also have to be shrunk to match the feature size. Especially since the interval between the metal wires has been shrunk from 45 nm to 15 nm in the 65 nm nanometer process, probably one third of the previously one, it creates a great challenge in terms of precise etching position and etching time duration. Thus how to efficiently fabricate the gate material 2 in response to gradually shrunken feature size has become an urgent issue in the semiconductor industry at present.

SUMMARY OF THE INVENTION

The primary object of the present invention is to solve the problems of making gate material in conventional vertical transistors that are difficult to control etching positions and etching duration during fabrication process of separating metal wires due to gradually shrunken feature size.

To achieve the foregoing object, the present invention provides a vertical transistor structure that includes a substrate, a plurality of pillars located on the substrate and spaced from each other at a selected distance, a gate line and a plurality of conductors. The pillars are aligned in a straight line in a first direction and have respectively a primary control wall along the first direction and two ancillary control walls perpendicular to the primary control wall. The gate line is connected to the primary control wall in the first direction through a first isolated layer and parallel with the substrate. The conductors are interposed between the ancillary control walls through a second isolated layer.

In addition, the invention provides a method of manufacturing vertical transistors that comprises the steps of:

S1: Forming a plurality of pillars on a substrate that are aligned in a straight line in a first direction. Each pillar has a primary control wall and two ancillary control walls perpendicular to the primary control wall;

S2: Providing an etching stop layer and an etching zone on one side of the pillar where the primary control wall is located. The etching stop layer is adjacent to the primary control wall;

S3: Etching the etching zone;

S4: Forming an isolation section on the etching zone;

S5: Removing the etching stop layer to form a channel, and forming a recess on one side of the pillar where the ancillary control walls are located; and S6: Depositing a conductive material on the surfaces of the recess and channel to form a conductor and a gate line, and providing a first isolated layer between the channel and the gate line and a second isolated layer between the recess and the conductor such that the conductor is adjacent to the ancillary control walls and parts of the gate line are adjacent to the primary control wall.

By means of the technique set forth above, the gate line is formed only on one side of the pillar where the primary control wall is located, and the conductors electrically connected to the gate line control ON/OFF at two ends of the pillar. Thus the problems of etching and separating the gate material in the conventional techniques that are difficult to control etching positions and etching duration to result in uneven or incomplete etching can be overcome.

The foregoing, as well as additional objects, features and advantages of the invention will be more readily apparent from the following detailed description, which proceeds with reference to the accompanying drawings.

DETAILED DESCRIPTION OF THE PREFERRED EMBODIMENTS

Figure 1:
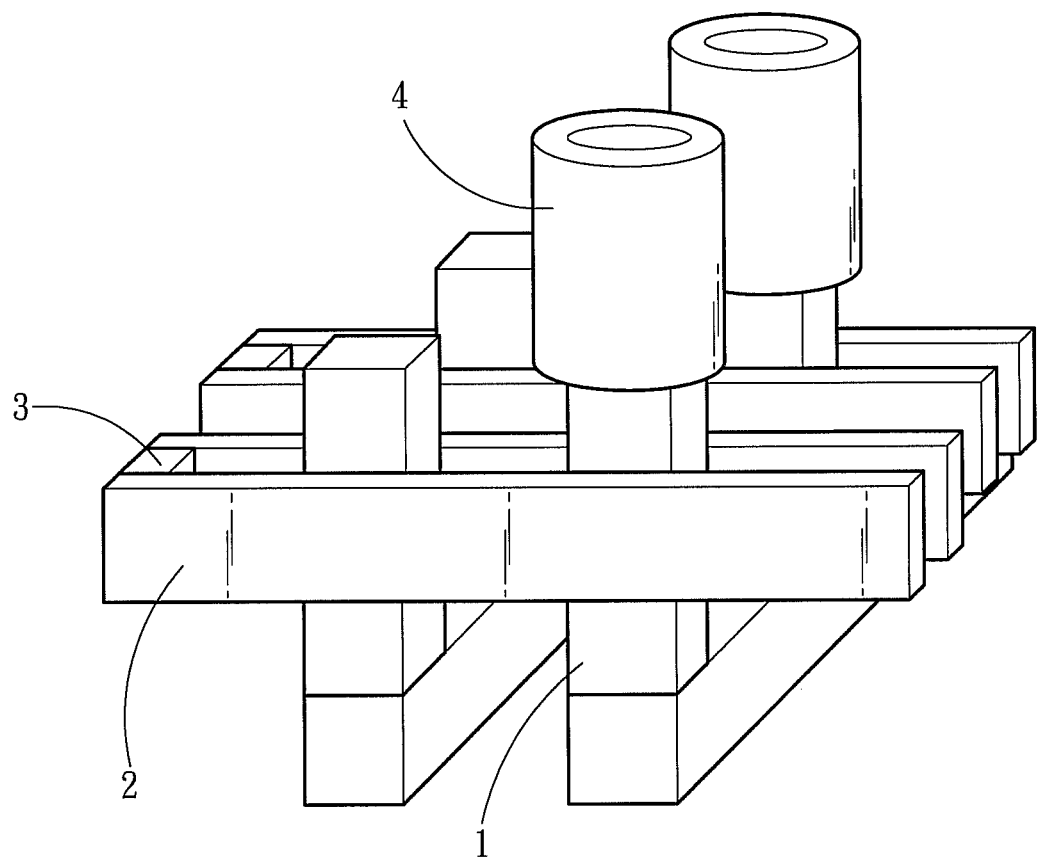
FIG. 1 is a perspective view of a conventional vertical DRAM.
Figure 2:
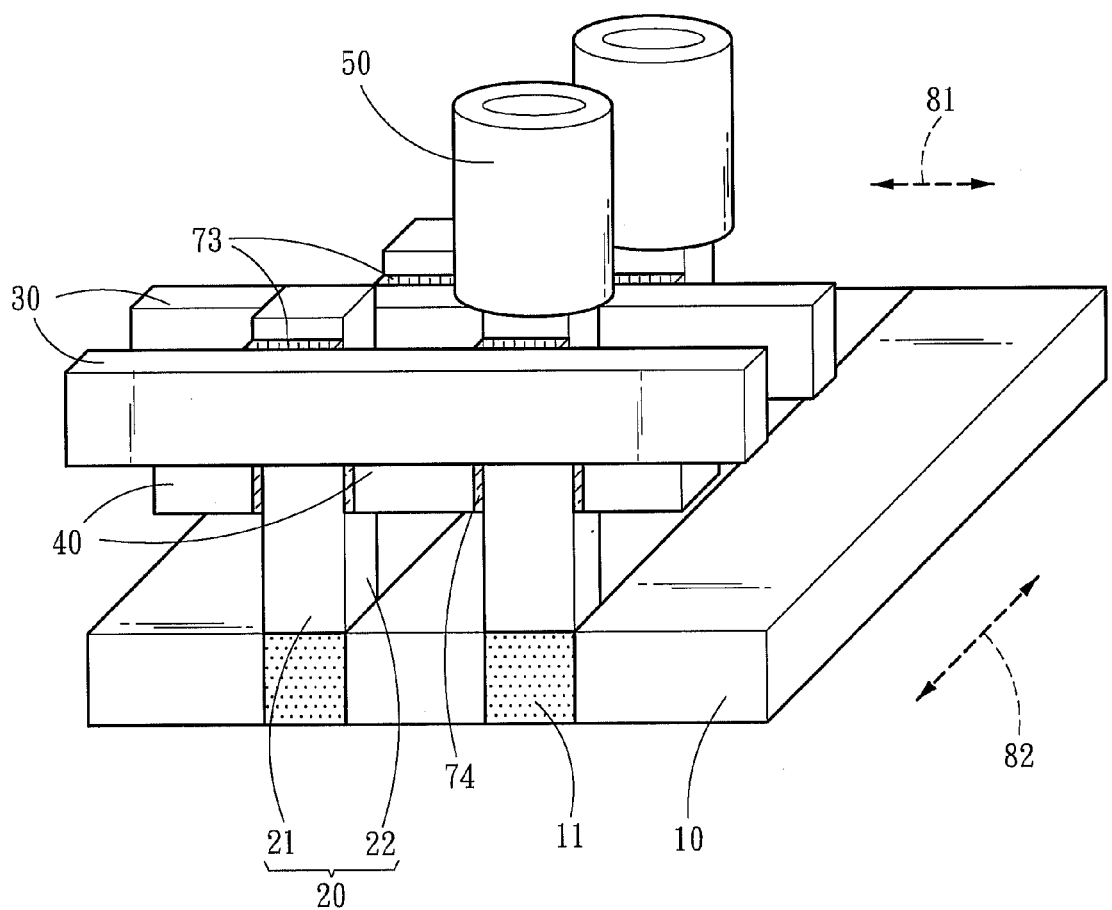
FIG. 2 is a perspective view of an embodiment of the invention.

Please refer to FIG. 2, the present invention aims to provide a vertical transistor structure. It is to be noted that a vertical DRAM is used as an example herein to facilitate discussion of movement and structure of a transistor, but it is not the limitation of the invention. The vertical transistor according to the invention includes a substrate 10, a plurality of bit lines 11 located on the substrate 10, a plurality of pillars 20 located on the substrate 10 and spaced from each other at a selected distance, a gate line 30 connecting to the pillars 20 through a first isolated layer 73 and a conductor 40 connecting to the gate line 30. The pillars 20 are aligned in a straight line in a first direction 81 and have respectively a primary control wall 21 along the first direction 81 and two ancillary control walls 22 perpendicular to the primary control wall 21. The bit line 11 is perpendicular to the first direction 81 and formed on the surface of the substrate 10 by doping ions via an ion implantation approach. In this embodiment, the pillars 20 are arranged in an array for data access of the memory. The gate line 30 is parallel with the substrate 10 in the first direction 81 and connected to the primary control wall 21 through the first isolated layer 73. The invention uses only the gate of the primary control wall 21 to control voltage. In other words, the gate line 30 is merely adjacent to the primary control wall 21, while another side of the pillar 20 remote from the primary control wall 21 does not have a gate formed thereon.

The conductors 40 are interposed between the ancillary control walls 22 of the pillars 20 through second isolated layers 74. Each pillar 20 has one end remote from the substrate 10 to couple with a capacitor 50. The gate line 30 is electrically connected to the conductors 40 to control ON/OFF at two ends (between the bit line 11 and capacitor 50) of the pillar 20 serving as a transistor and read or write electric charges in the capacitor 50.

Figure 3B:
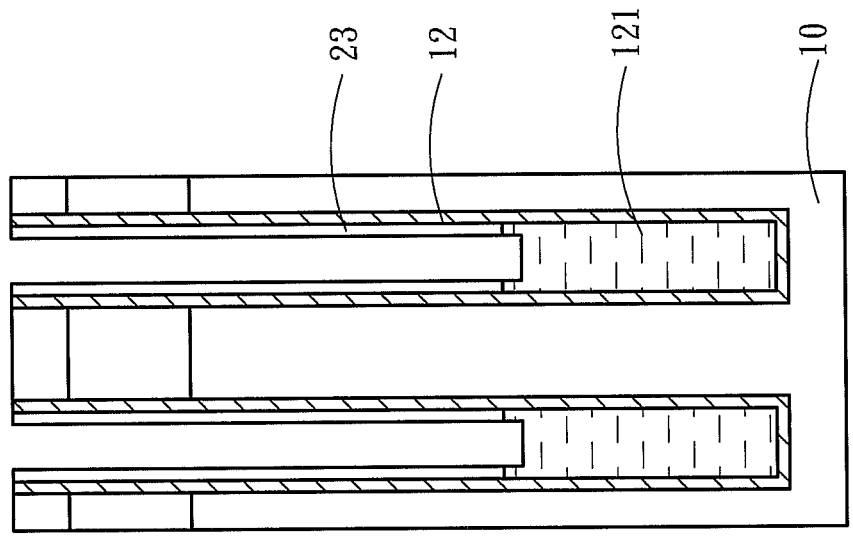
FIGS. 3A through 3E are schematic views of an embodiment of the manufacturing process to fabricate a pillar according to the invention.
Figure 3A:
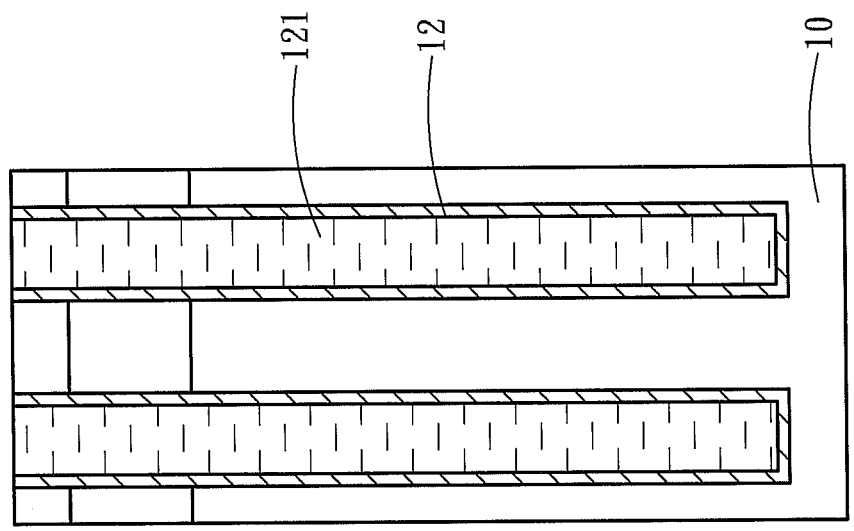

Also refer to FIGS. 3A through 3E for a method of manufacturing the vertical memory of the invention. It comprises the steps as follows:

S1: Forming a plurality of pillars 20 on a substrate 10 that are aligned in a straight line in a first direction 81. In this embodiment, the pillars 20 further are aligned in a second direction 82 perpendicular to the first direction 81 to form an array. The pillars 20 can be formed according to the following processes:

S1A: Etching the substrate 10 to form a plurality of first trenches 12 as shown in FIG. 3A, and filling an oxide 121 in the first trenches 12. In this embodiment, the substrate 10 is made of silicon, and the oxide 121 can be silica ($SiO_2$).

S1B: Etching the oxide 121 and performing liner deposition as shown in FIG. 3B. After the oxide 121 has been dry-etched or wet-etched at a selected depth, silicon nitride is linearly deposited on the side walls of the oxide 121 to form a protective layer 23.

Figure 3D:
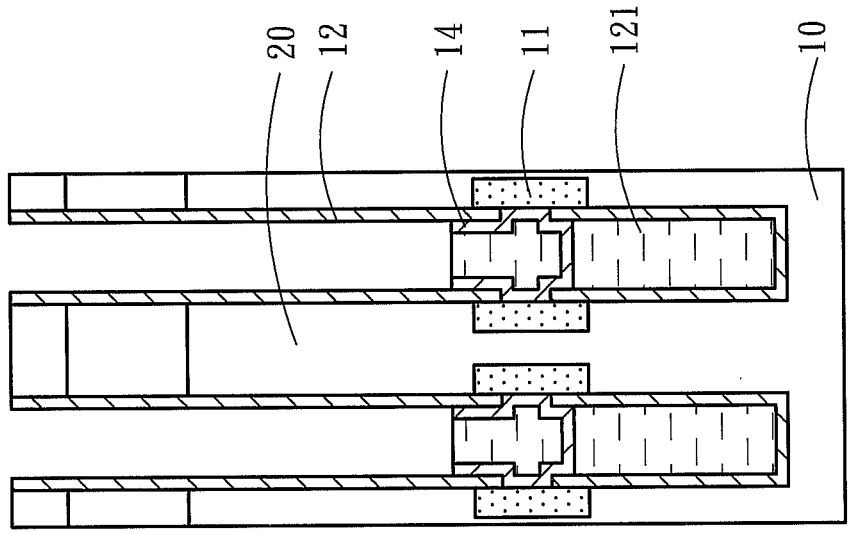
Figure 3C:
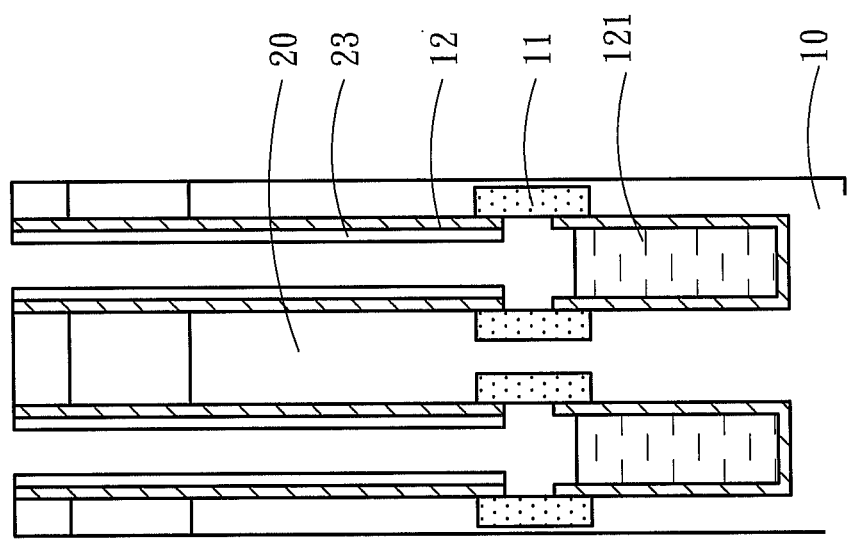

S1C: Forming a bit line 11 on the substrate 10 as shown in FIG. 3C by doping at a position corresponding to the pillars 20.

Figure 3E:
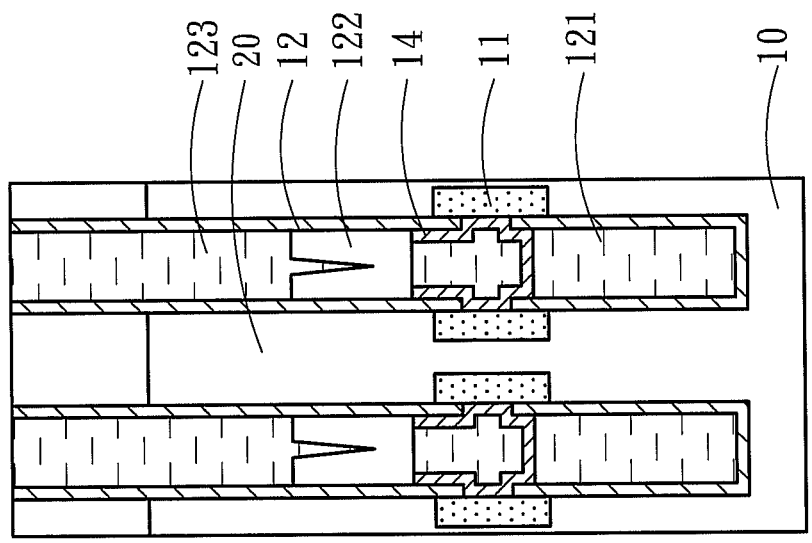

S1D: Forming an isolation layer 14 by filling the first trenches 12 corresponding to the bit line 11 as shown in FIGS. 3D and 3E. The isolation layer 14 isolates the bit line 11 from the exterior. The first trenches 12 are filled with a silicon nitride layer 122 and an oxide material 123.

Figure 4A:
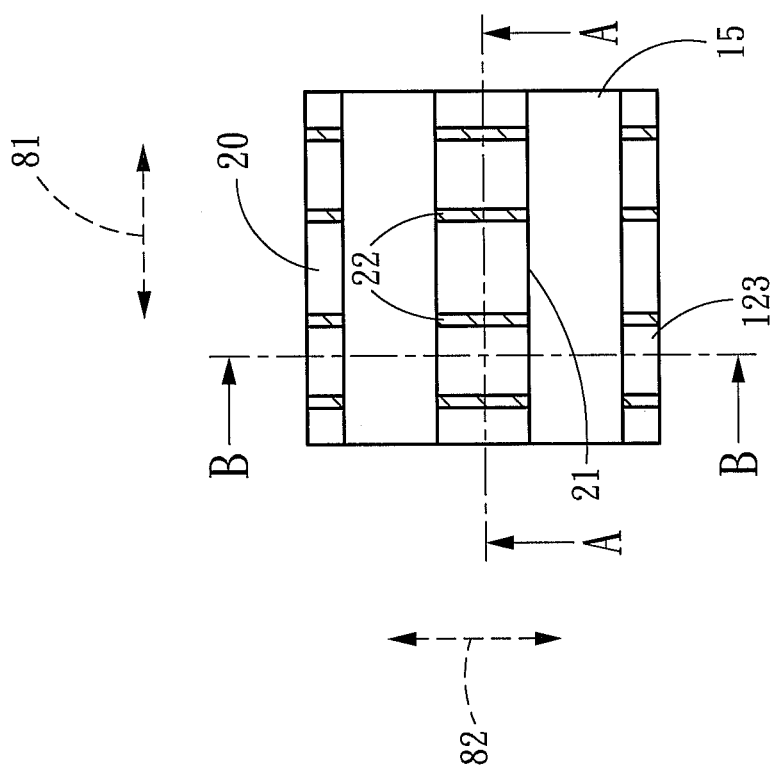
FIGS. 4A through 4C are schematic views of an embodiment showing that the pillar are divided into multiple sets at different angles according to the invention.
Figure 4C:
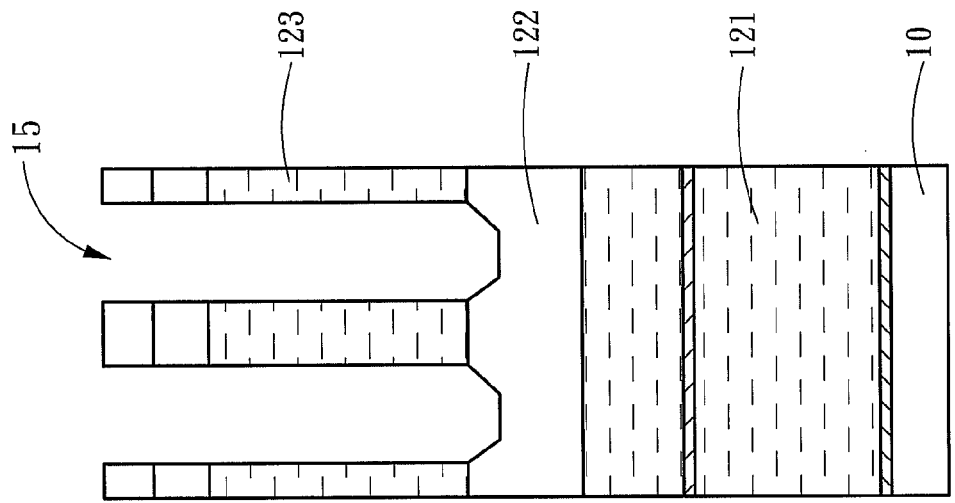
Figure 4B:
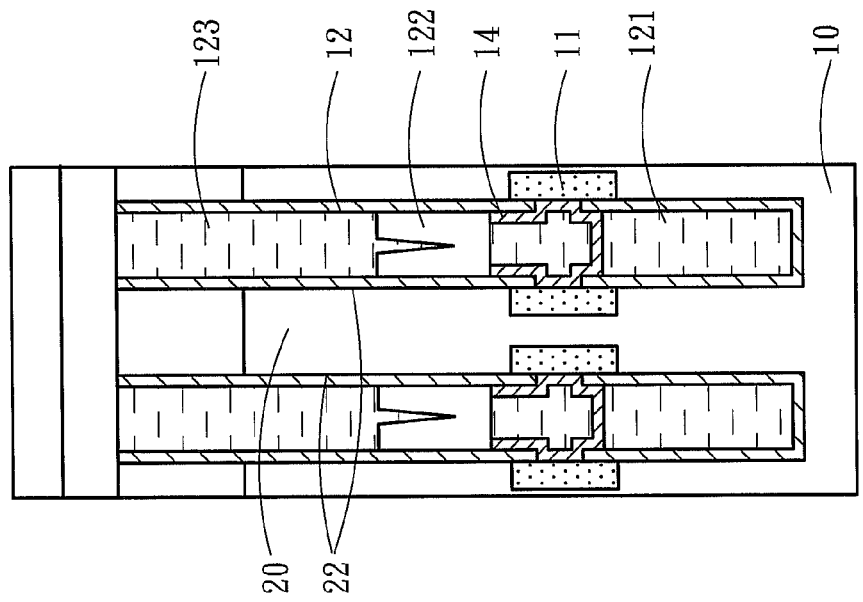

S1E: Forming a plurality of second trenches 15 perpendicular to the first trenches 12 to finish formation of the pillars 20. Also refer to FIGS. 4A through 4C for the top view and the sectional views on line A-A in the first direction 81 and on line B-B in the second direction 82. After step S1D is finished, a plurality of second trenches 15 are formed via etching in the first direction 81 to finish formation of the pillars 20. Then the gates are prepared to be formed. Each pillar 20 has a primary control wall 21 along the first direction 81 and two ancillary control walls 22 parallel with the second direction 82.

Figure 5A:
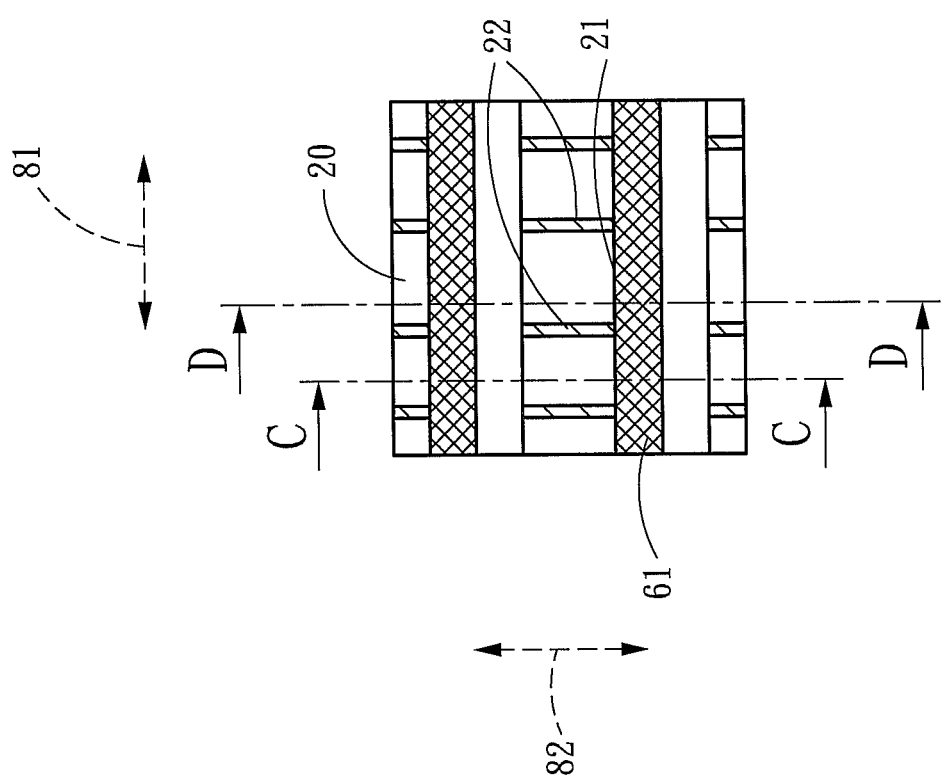
FIGS. 5A through 5C are schematic views of an embodiment showing that an etching stop layer is provided at different angles according to the invention.
Figure 5C:
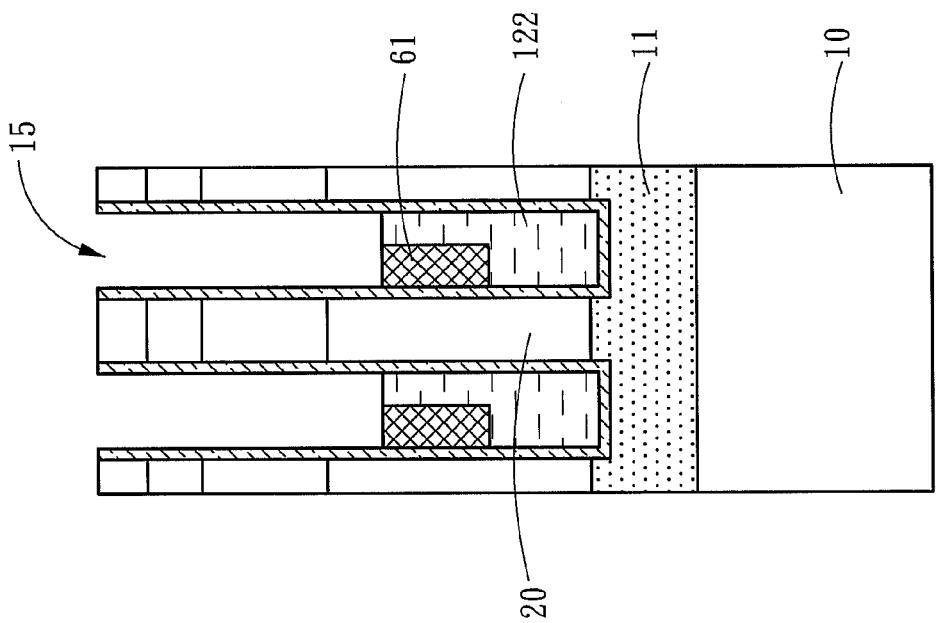
Figure 5B:
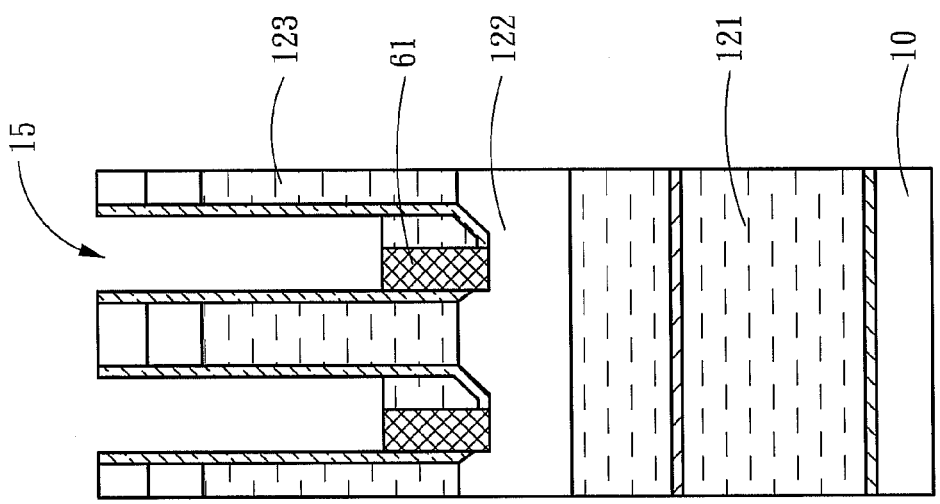

S2: Providing an etching stop layer 61 and an etching zone 62 on one side of the pillar 20 where the primary control wall 21 is located. The etching stop layer 61 is adjacent to the primary control wall 21. Also refer to FIG. 5A through FIG. 5B for the top view and the sectional views on line C-C in FIG. 5A that represents an area formed by the first trench 12 outside the pillars 20 and on line D-D in FIG. 5A that represents an area where the pillars 20 are formed. The etching stop layer 61 is formed on one side of the pillar 20 to define an etching zone 62 (referring to FIG. 6A). In this embodiment, the etching stop layer 61 is made of titanium nitride (TiN).

Figure 6A:
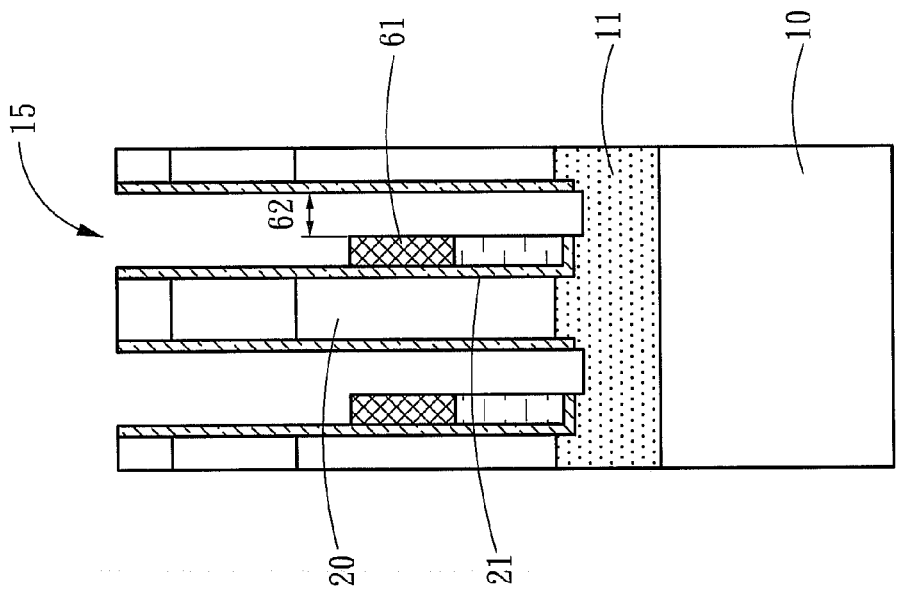
FIGS. 6A and 6B are schematic views of an embodiment showing that the etching stop layer is etched at different angles according to the invention.
Figure 6B:
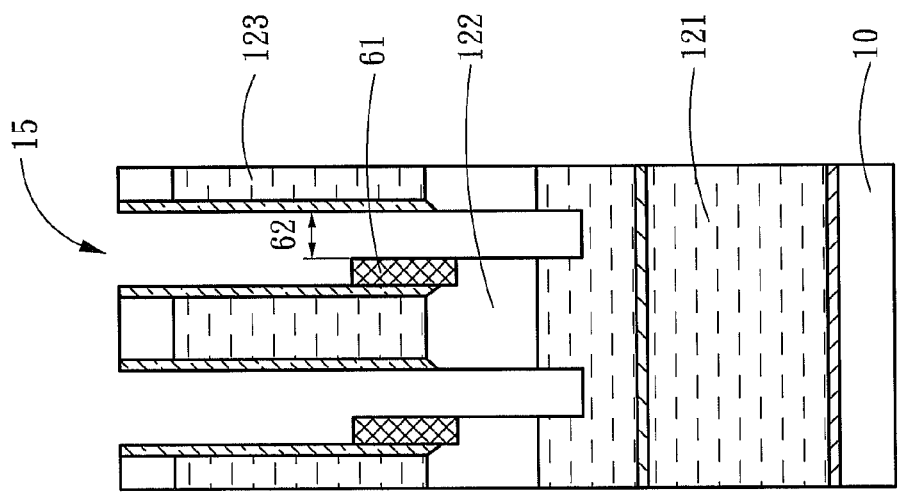

S3: Etching the etching zone 62 in the second trench 15. Refer to FIGS. 6A and 6B that are respectively the following process of FIGS. 5B and 5C, with FIG. 6A showing the lateral cross section of the non-pillar area of the first trench 12 and FIG. 6B showing the lateral cross section corresponding to the pillar 20. The oxide material 123 and silicon nitride layer 122 on the etching zone 62 are etched and removed via an anisotropic etching approach.

Figure 7A:
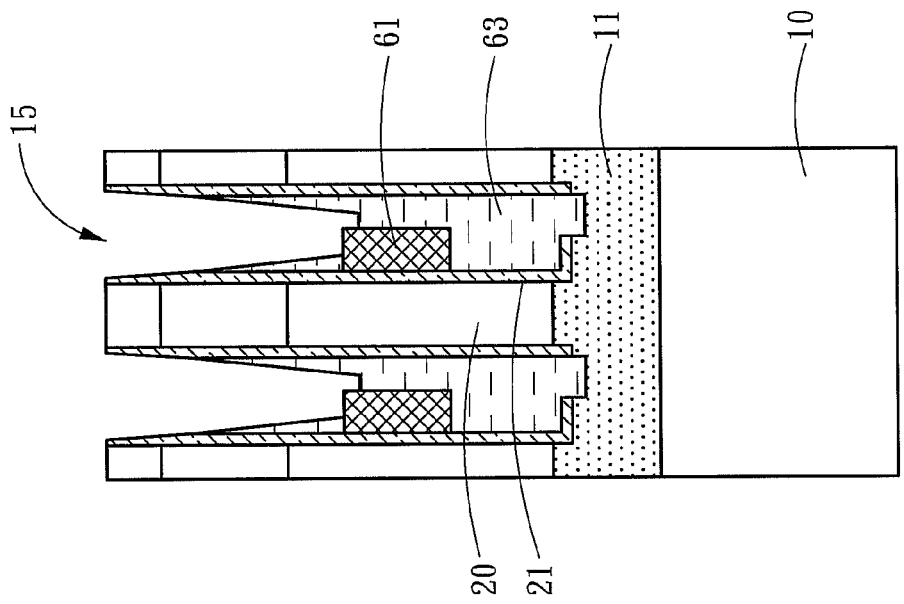
FIGS. 7A and 7B are schematic views of an embodiment showing that an insulation material is filled at different angles according to the invention.
Figure 7B:
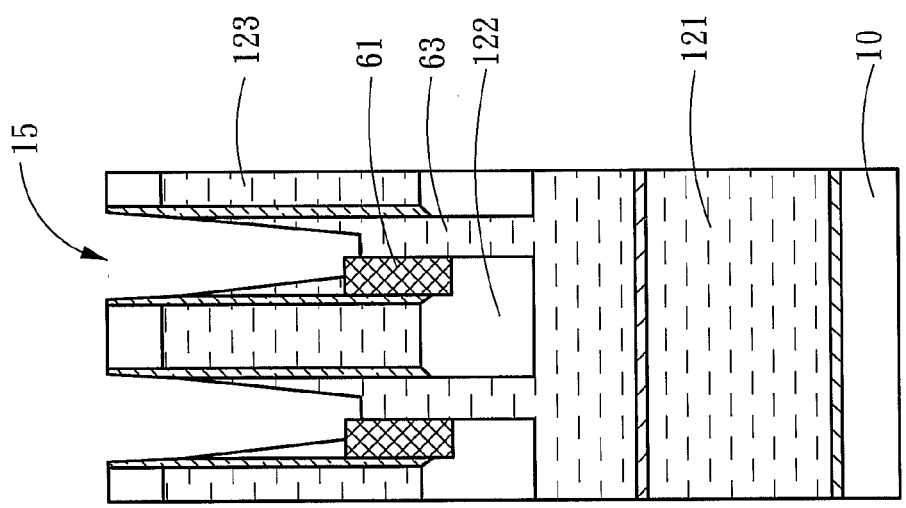

S4: Forming an isolation section 63 in the etching zone 62. Refer to FIG. 7A for a lateral cross section of the non-pillar area and FIG. 7B for a lateral cross section corresponding to the pillar 20, and the same principle is applied to the drawings hereinafter. After the silicon nitride layer 122 has been removed, the oxide material 123 is again filled in the etching zone 62 to form the isolation section 63 while a portion of the silicon nitride layer 122 remains in the non-pillar area. However, the material filled in the etching zone 62 is not limited to the oxide material 123, other oxide materials also can be adopted.

Figure 8A:
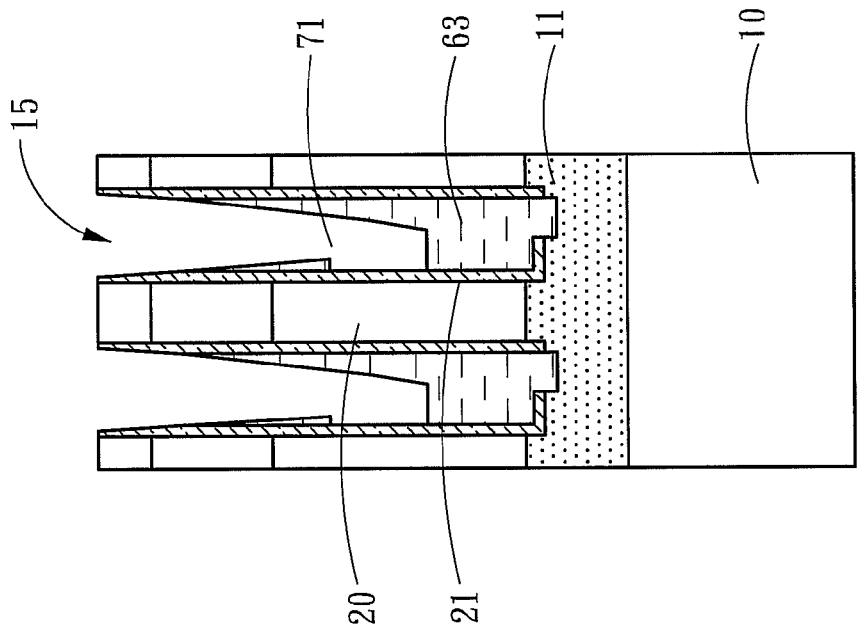
FIGS. 8A and 8B are schematic views of an embodiment showing that a housing compartment is formed at different angles according to the invention.
Figure 8B:
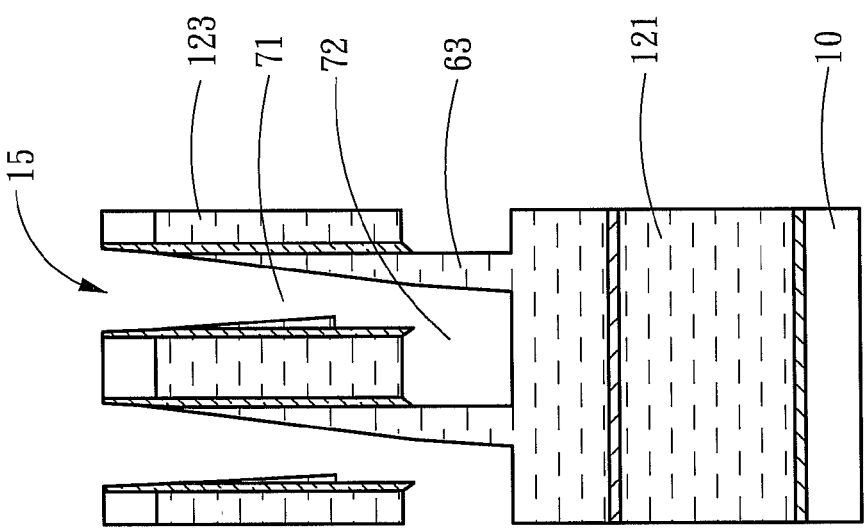

S5: Removing the etching stop layer 61 and residual silicon nitride layer 122 to form a channel 71 and a recess 72 as shown in FIGS. 8A and 8B. The etching stop layer 61 and silicon nitride layer 122 are removed sequentially by a dry-etching or wet-etching approach to form the channel 71 and recess 72 while the isolation section 63 remains to isolate the recesses 72 at different zones from communicating with each other.

Figure 9A:
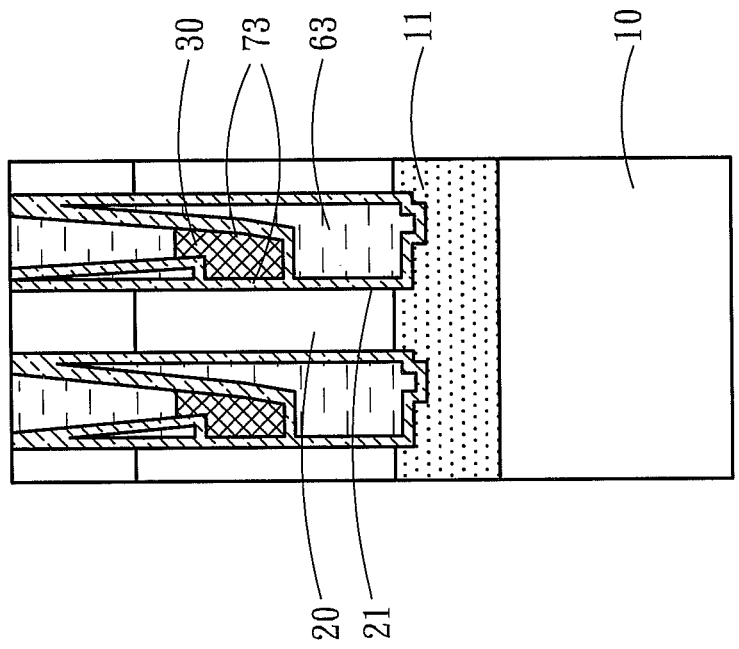
FIGS. 9A and 9B are schematic views of an embodiment showing that a conductor is formed at different angles according to the invention.
Figure 9B:
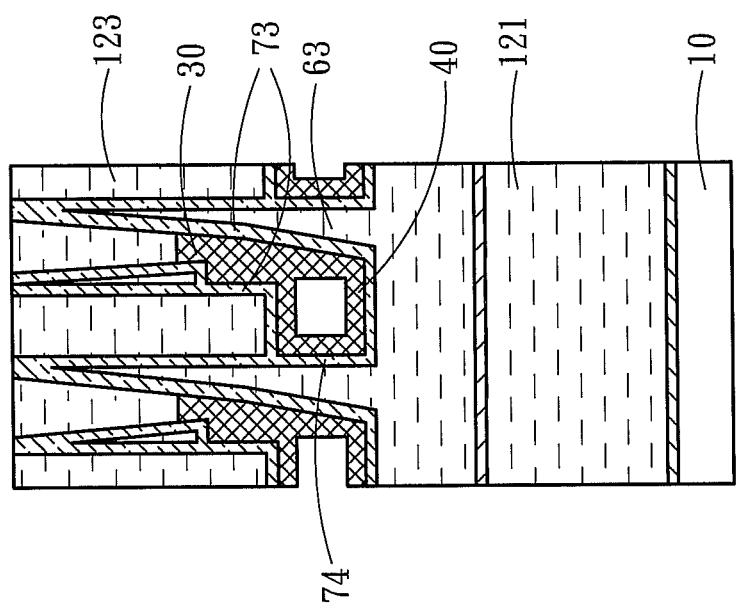

S6: Forming a conductor 40 and a gate line 30 by depositing a conductive material on the surfaces of the channel 71 and recess 72 via a chemical vapor phase deposition approach as shown in FIG. 9A. It should be noted that before the conductor 40 and the gate line 30 are deposited on the surfaces of the channel 71 and the recess 72, a first isolated layer 73 and a second isolated layer 74 can be respectively formed on the surface of the channel 71 and the surface of the recess 72 such that the first isolated layer 73 is interposed between the gate line 30 and the channel 71 and the second isolated layer 74 is interposed between the conductor 40 and the recess 72, thereby is avoided the problem of the current leakage. In this embodiment, the conductor 40 is a hollow structure formed via the chemical vapor phase deposition. FIG. 9B illustrates the gate line 30 formed on the surface of the isolation section 63 by extending from the conductor 40 via the chemical vapor phase deposition. Because of the isolation section 63, parts of the gate line 30 are adjacent to the primary control wall 21 of the pillar 20 through the second isolated layer 74 without connecting to a neighboring pillar 20. Moreover, because the isolation section 63 and recess 72 are formed in special shapes, the gate line 30 is formed at an upper diagonal location of the conductor 40, i.e. the gate line 30 and substrate 10 are spaced from each other at a distance greater than that between the conductor 40 and substrate 10. Otherwise, if the gate line 30 and conductor 40 are located at the same level, erroneous conduction or interference could occur to cause signal capture error or inaccuracy. The invention, by positioning the conductor 40 and gate line 30 at different levels, the problem of electric conduction in the channel 71 caused by ion attraction resulting from electric field created by the voltage at two sides of the pillar 20 can be avoided.

S7: Fabricating capacitors. Also referring to FIG. 2, after the gate line 30 and conductor 40 are formed, a capacitor 50 is fabricated and formed at one end of the pillar 20 remote from the substrate 10.

As a conclusion, the invention forms the gate line 30 only at one side of the pillar 20 where the primary control wall 21 is located, and controls ON/OFF at two ends of the pillar 20 via the conductors 40 electrically connected to the gate line 30. Hence the problems of etching and separating the gate material in the conventional techniques that are difficult to control etching positions and etching duration to result in uneven or incomplete etching can be overcome. Moreover, the invention provides the gate line 30 and conductors 40 at different elevations, the problems of erroneous conduction or signal interference also can be prevented. Finally, the invention also provides a method of manufacturing a vertical transistor that forms first the channel 71 and recess 72, and then forms integrally the gate line 30 and conductors 40 via chemical vapor phase deposition. Fabrication is simpler. It provides significant improvements over the conventional techniques.

While the preferred embodiments of the invention have been set forth for the purpose of disclosure, modifications of the disclosed embodiments of the invention as well as other embodiments thereof may occur to those skilled in the art. Accordingly, the appended claims are intended to cover all embodiments which do not depart from the spirit and scope of the invention set forth in the claims.

What is claimed is:

1. A vertical transistor structure, comprising:
a substrate;
a plurality of pillars located on the substrate and spaced from each other at a selected distance and aligned in a straight line in a first direction, each of the plurality of pillars including a primary control wall along the first direction and two ancillary control walls perpendicular to the primary control wall;
a gate line being parallel with the substrate to connect the primary control walls of the plurality of pillars through first isolated layers in the first direction; and
a plurality of conductors connecting to the gate line and being interposed between the ancillary control walls through second isolated layers,
wherein the gate line and the substrate are spaced at a distance greater than a distance between the plurality of conductors and the substrate.

2. The vertical transistor structure of claim 1, wherein the substrate includes a plurality of bit lines perpendicular to the first direction and corresponding to the pillars.

3. The vertical transistor structure of claim 2, wherein the plurality of bit lines are formed on a surface of the substrate by ion implantation.

4. The vertical transistor structure of claim 1, wherein the pillar is coupled with a capacitor at one end remote from the substrate.

* * * * *